US006326898B1

United States Patent
O'Leyar et al.

(10) Patent No.: US 6,326,898 B1
(45) Date of Patent: Dec. 4, 2001

(54) SOLENOID PLUNGER POSITION DETECTION ALGORITHM

(75) Inventors: Stephen C. O'Leyar, Fairport; Robert P. Siegel, Penfield, both of NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/695,680

(22) Filed: Oct. 24, 2000

(51) Int. Cl.[7] .................................................. G08B 21/00
(52) U.S. Cl. ....................... 340/635; 340/644; 340/653; 361/160; 361/206
(58) Field of Search .................................. 340/635, 644, 340/652, 653, 654, 657; 361/152, 154, 160, 206; 73/121

(56) References Cited

U.S. PATENT DOCUMENTS

| 3,946,285 | | 3/1976 | Beery et al. ........................ 317/123 |
| 5,196,983 | * | 3/1993 | Stumpf .................................. 361/154 |
| 5,481,187 | | 1/1996 | Marcott et al. .................. 324/207.16 |
| 5,784,245 | * | 7/1998 | Moraghan et al. ................... 361/154 |
| 5,835,876 | * | 11/1998 | Hathaway et al. ...................... 701/62 |
| 5,847,274 | * | 12/1998 | Schaffer .............................. 73/118.1 |
| 5,986,871 | * | 11/1999 | Forck et al. ........................ 361/160 |
| 5,995,356 | * | 11/1999 | Glavmo et al. ...................... 361/154 |
| 6,111,514 | * | 8/2000 | Cossins et al. ...................... 340/654 |

* cited by examiner

Primary Examiner—Daniel J. Wu
Assistant Examiner—Toan Pham
(74) Attorney, Agent, or Firm—Lahive & Cockfield LLP

(57) ABSTRACT

A method and apparatus for diagnosing whether a solenoid in an image forming system is functioning properly is disclosed. An actuating current is sent to a particular solenoid while a current waveform and elapsed time such as pull-in time value are noted for instances when the solenoid is in a first position and a second position. The first position can be one in which a solenoid plunger is extended and the second position can be one in which the solenoid plunger is retracted, or vice versa. Based at least partially on the measured actuating current values prior to the beginning and after the ending of solenoid movement, and measured time values, a determination can be made as to whether the solenoid is functioning properly by comparing these values to predetermined values for a properly functioning solenoid.

19 Claims, 7 Drawing Sheets

SOLENOID PLUNGER POSITION DETECTION ALGORITHM

FIELD OF THE INVENTION

The invention relates to an image forming system, and more particularly relates to a system and method for determining the operability of a solenoid used in the image forming system.

BACKGROUND OF THE INVENTION

Today, electrophotographic printing systems, such as digital copiers, are widely used in many business and commercial environments. In a digital copier, an image of a document is captured by an input scanning facility, and converted into selected digital image data. This image data is then typically compressed by a control unit, then either forwarded to a suitable printing module or stored in system memory.

In general these image forming systems contain a plurality of solenoids. The solenoids perform many different functions within the image forming system. In order to improve the quality and reliability of manufactured machines, the health of the various components that constitute the machines is important. The most common failure mode of a solenoid is that it does not pull-in all the way or drop-out all the way in a specified amount of time.

One common technique for measuring solenoid health is by computing the time required for the solenoid plunger to pull-in from an initial position of extension, or drop-out from an initial position of retraction. If the solenoid plunger moves in an amount of time equal to a predetermined "pull-in" time, or "drop-out" time, then the solenoid is deemed to be functioning properly. This time measurement technique assumes two things: the solenoid plunger actually began at the full out position, and the solenoid plunger actually ended at the full-in position, or vice-versa.

Experience, however, has shown that an improperly functioning solenoid can appear to be functioning properly if solely judged by the pull-in time. For example, in situations where a solenoid fails to drop-out completely because the frictional force between the plunger and solenoid barrel is too great for the return spring to overcome, the measured pull-in time may still meet specification. This is because the plunger, which is not actually pulling in the full and complete stroke, is moving a less than complete distance in the predetermined amount of time according to specification. The converse may also occur. For example, in situations where a solenoid may not always pull completely in because it cannot overcome an external load and/or internal friction forces, the drop-out may appear to be normal because movement occurred in the predetermined amount of time according to specification, although the solenoid did not drop-out the full and complete stroke.

Experience has also shown that an improperly functioning solenoid can also appear to be operating properly if solely judged by current values in particular regions of a current waveform. To further clarify, when an improperly functioning solenoid moves from a fully extended position to a fully retracted position, or vice versa, in an inordinate, or excessive, amount of time, the measured current values may still appear correct with regard to solenoid position, even though the solenoid is actually malfunctioning.

SUMMARY OF THE INVENTION

For the foregoing reasons, there exists in the art a need for a system and method for determining if a solenoid is functioning properly by considering whether the solenoid plunger fails to move completely between a fully extended and fully retracted position in a predetermined time period. The present invention is directed toward further solutions in this art.

The present invention provides a method for diagnosing whether a solenoid is functioning properly in an image forming system by providing an actuating voltage with an associated value to activate a solenoid. A corresponding actuating current is measured, along with a time value, at an initial stage. A plunger of the solenoid moves between a first position and a second position. Based at least partially on the measured actuating current before and after plunger movement, and time values at the beginning and ending points of the plunger movement, a determination can be made as to whether the solenoid is functioning properly.

According to another aspect, the measured time and actuating current values are compared with predetermined time and actuating current values for plunger movement initiation, and plunger movement cessation, which correspond to a properly functioning solenoid. The differences between the measured actuating current and time values and the predetermined actuating current and time values are calculated, and the differences serve as an indication as to whether the solenoid is functioning properly based at least partially on whether the differences are within or outside a predetermined range.

According to still another aspect, the determining step includes evaluating the measured actuating current and time values relative to predetermined actuating current and time values for properly functioning solenoids. The measured actuating current and time values are then compared with predetermined actuating current and time values, such that if there is a substantial match within a predetermined margin of error or range, then the solenoid is considered to be properly functioning.

According to still another aspect, the predetermined actuating current and time values can be determined by either empirical or formulaic procedures.

BRIEF DESCRIPTION OF THE DRAWINGS

The aforementioned features and advantages, and other features and aspects of the present invention, will become better understood with regard to the following description accompanying drawings, wherein.

DETAILED DESCRIPTION OF THE INVENTION

Figure 1:
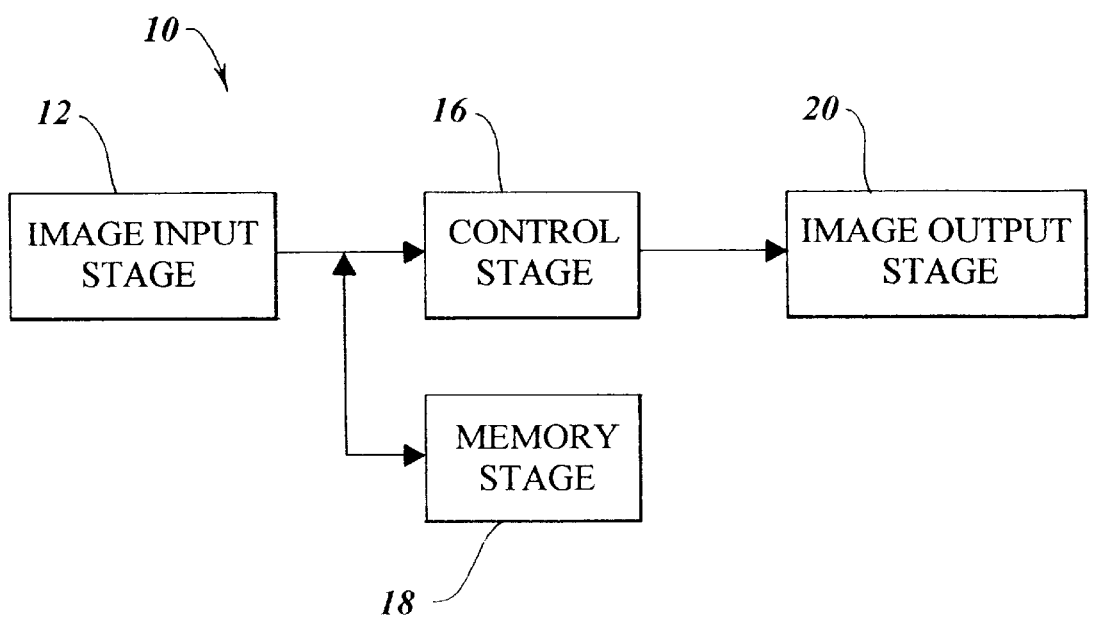
FIG. 1 is a schematic block diagram of an image reproducing system suitable for employing one or more solenoids and a data storage and retrieval system according to one embodiment of the present invention.

Referring now in detail to the drawings wherein like parts are designated by like reference numerals throughout, FIGS. 1 through 8 illustrate a system and method for diagnosing whether a solenoid is functioning properly according to the present invention. Although the present invention will be described with reference to the example embodiments illustrated in the figures, it should be understood that the present invention can be embodied in many alternative forms, and need not necessarily be applied only to image forming systems. In addition, any suitable size, shape, or type of elements or materials can be utilized.

The present invention provides a method of diagnosing a level of functionality in multiple solenoid actuators within an image forming or reproducing system. The method can be employed for solenoids in any type of machine, or even independent of any machinery. The method is also valid for those solenoids found in a number of different types of image reproducing systems. Examples of image reproducing systems include electrophotographic, electrostatic, ionographic, and other types of image forming or reproducing systems that are adapted to capture and/or store image data associated with a particular object, such as a document.

One broad example of a general image forming or reproducing system employing one or more solenoids diagnosable by an embodiment of the present invention is illustrated in FIG. 1. The illustrated image reproducing system 10 includes an image input stage 12 that is adapted to acquire or receive image data, such as an image of a document. The image data is then transferred to either or both a control stage 16 and a memory stage 18. The memory stage 18 can include any suitable storage or memory module adapted for storing the image data, examples of which include RAM, ROM, floppy disks, hard drives, and the like. The control stage 16 includes an arrangement for controlling the retrieval from or transfer to of image data in the memory stage 18, as well as controlling the transfer of image data to an image output stage 20. The illustrated image output stage 20 can include any suitable apparatus for reproducing the image on a substrate, such as a conventional printer or copier.

One example embodiment of the present invention is particularly directed to the use of a method for analyzing whether a solenoid 38, or collection of solenoids, are functioning properly, or whether there is some abnormal behavior and/or some malfunctioning device. For the sake of simplicity and clarity, the solenoids 38 will be described in connection with their use in an image printing system, such as the electrophotographic printing system of FIGS. 1 & 2, although uses in other systems and environments, whether or not related to copying or printing, are also contemplated by the present invention.

Figure 2:
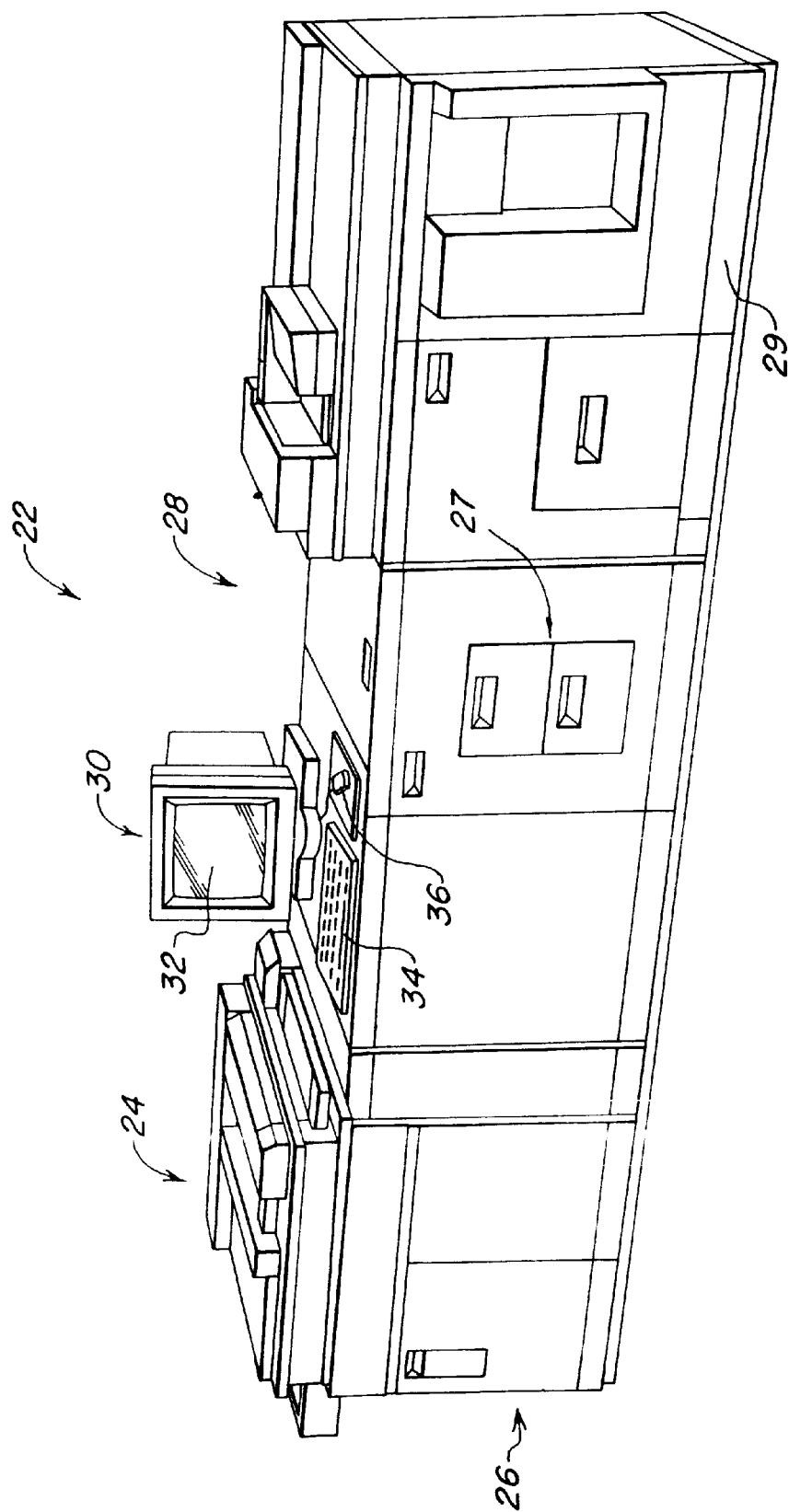
FIG. 2 is a perspective view of an example image reproducing system suitable for employing one or more solenoids and the data storage and retrieval system according to one embodiment of the present invention.

FIG. 2 is a perspective view of a general electrophotographic printing system, such as a digital copier. The illustrated printing system 22, for purposes of explanation, can be divided into multiple sections according to functionality, such as the image input stage 24, control stage 26, paper supply 27, image output or printer stage 28, and finisher stage 29. In the illustrated printing system 22, the image input stage 24 can include both local (e.g., on-site) and remote image inputs, thus enabling the printing system 22 to provide network, scan, and print services in a single integrated system. Although not illustrated herein, other system combinations and arrangements can also be employed in the printing system 22 and are known to the ordinarily skilled artisan, such as a stand alone printing system with on-site image input (i.e., a scanner), controller, and printer assemblies; a network printing system with remote input, controller, paper, printer, and finisher assemblies; and like system configurations.

In addition, while a specific printer stage 28 is shown and described in the exemplary printing system 22, the present invention also contemplates using other types of printing systems. For example, the printer stage 28 can instead employ an ink jet printer, an ionographic printer, a thermal printer, a photographic printer, etc. Furthermore, imaging functions of the printer stage 28 can be incorporated in electronic display systems, such as CRTs, LCD's, LED's, or other like image scanning, processing, or recording systems, or alternatively, other signal transmitting, receiving and recording systems.

For remote or off-site acquisition or inputting of image data into the printing system 22, the image input stage 24 can include a network interface (not shown) with a suitable communication channel, such as a telephone line, enabling image data in the form of image signals or pixels to be inputted or introduced to the image input stage 24 from one or more remote sources for processing. Other remote sources of image data such as streaming tape, floppy disk, video camera, and the like are also contemplated by example embodiments of the present invention.

For on-site image input, the image input stage 24 may include a scanner (not shown) that can employ a universal or automatic document handler (not shown) for the purpose of automatically and sequentially placing and locating documents for scanning. Conversely, a manual mode document mode and/or a Computer Forms Feeder (CFF) mode can also be provided, the latter to accommodate documents in the form of computer fanfold.

The user interface 30 can include a combined operator controller/CRT display consisting of an interactive touchscreen 32, keyboard 34, and mouse 36, FIG. 2. The user interface 30 preferably enables the operator to interface with the printer stage 28, so as to program print jobs and other instructions, and to obtain system operating information, instructions, programming information and icons, diagnostic information, visual document facsimile display and pictorial views, and the like. Items displayed on the touchscreen 32, such as files and icons, are actuated by either touching the displayed item on the screen 32 or by using the mouse 36 to manipulate a cursor (not shown) to select an item.

The electrographic printing system 22 can also include a paper supply section 27, and a finisher stage 29. As will be appreciated by those skilled in the art, the print media can comprise a selected one of various known substrates which are capable of accepting an image, examples of which include transparencies, preprinted sheets, vellum, glossy covered stock, film and the like. The print media can also comprise any of a variety of sheet sizes, types, and colors, and for this, plural media supply trays of the paper supply section 27 can be provided. The developed image transferred to the print media can be permanently fixed or fused and the resulting prints discharged either to an output tray or to the finisher stage 29. The finisher stage 29 provides certain finishing selections (not shown) such as a stitcher for stitching or stapling the prints together to form books, a thermal binder for adhesively binding the prints into books, and/or other finishing options such as slitting, perforating, saddle stitching, folding, trimming, or the like.

Within the electrographic printing system 22, and all of the various systems described, solenoids are found in a plurality of locations and functions. Typically, one of the most common functions of the solenoids 38 is to control paper as it moves through the machine paper path. This is often done by moving baffles that direct the direction of paper in the paper path. Further, solenoids 38 often lower drive belts or rollers onto paper. After the paper path places the paper below these belts or rollers, these belts or rollers make contact with the paper through action by actuating solenoids 38. After the paper moves away via the belt or roller, the solenoids 38 de-energize and pull out of the way with a return spring to allow for entry of the next sheet of paper coming down the paper path. Other numerous functions, not mentioned herein, are executed by solenoids within image forming machines, as well as within other types of machines and systems.

Because there are so many uses for solenoids 38 in the electrographic printing system 22, any image reproducing system 10, or other machinery and systems, there is a constant and continuing need to ensure that the solenoids 38 are functioning properly. In an example embodiment of the present invention, a method is provided for analyzing a particular solenoid 38 and determining whether or not it is properly functioning. Although described in connection with one solenoid, the diagnosis can be performed on a plurality of solenoids, independently, or simultaneously.

Figure 3:
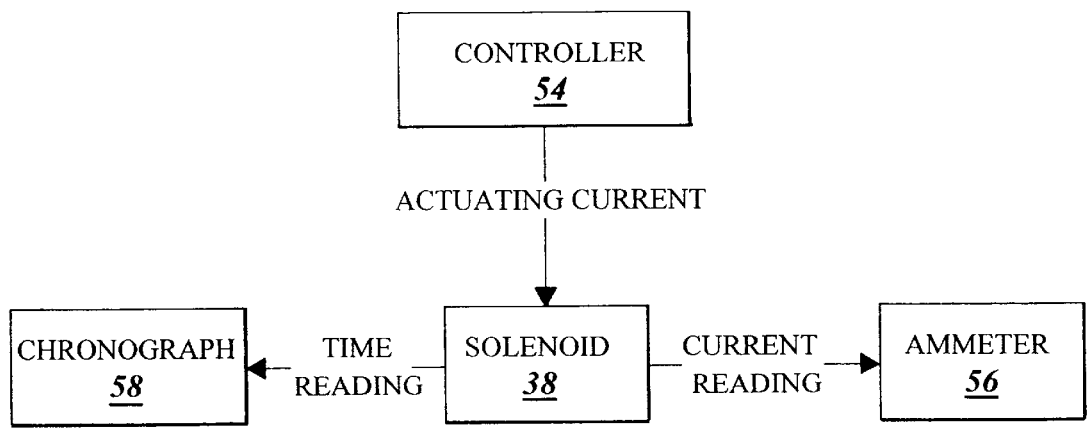
FIG. 3 is a schematic representation of components for determining the operability of a solenoid according to the teachings of the present invention.

As depicted in FIG. 3, in an example embodiment of the analysis of a solenoid 38, a controller 54, (such as from the control stage 16), sends an actuating current to the solenoid 38. While this occurs, an ammeter 56 measures the current value, generally in milliamperes, and an initial time value is monitored, recorded, or stored by a chronograph 58. One skilled in the art will comprehend that the ammeter 56 and chronograph 58 devices, as referred to throughout this disclosure, are merely representative of a device or collection of devices utilized to measure electrical current and time. Specific and separate ammeter 56 and chronograph 58 devices are not necessarily required by the present invention. They can be replaced with, e.g., a notebook computer accessorized with a current sensor and utilizing its own internal clock as a chronograph. Other like devices are contemplated by the present invention. Further, the controller 54 is intended merely as a representation of any device or collection of devices for controlling current flow to the solenoid 38.

Figure 4:
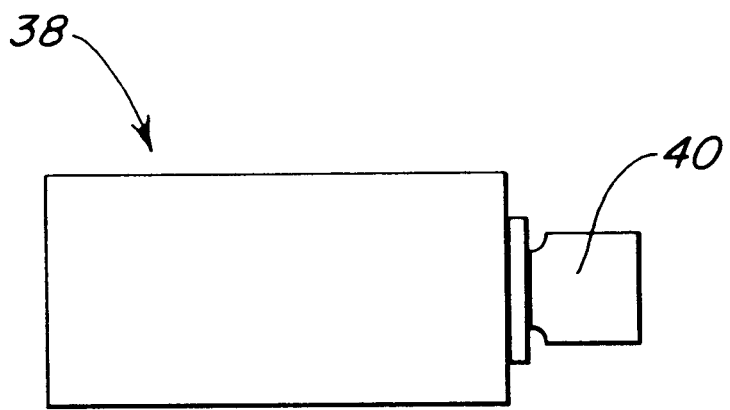
FIGS. 4 & 5 are diagrammatic views of a solenoid in the image reproducing system according to one embodiment of the present invention.
Figure 5:
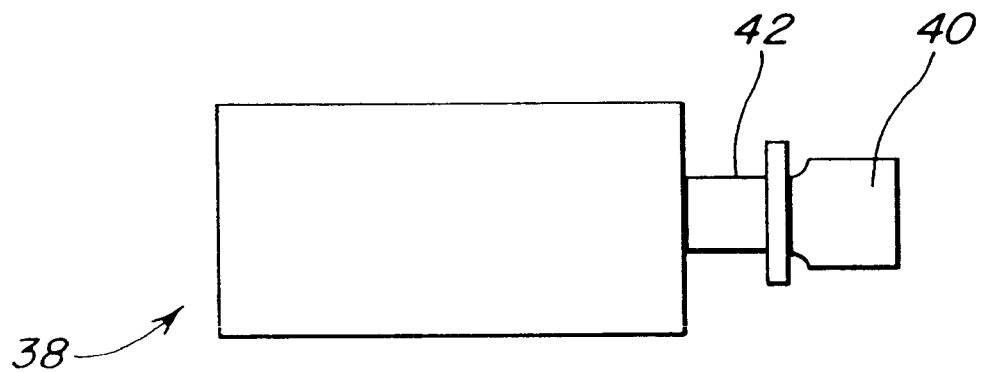
Figure 6:
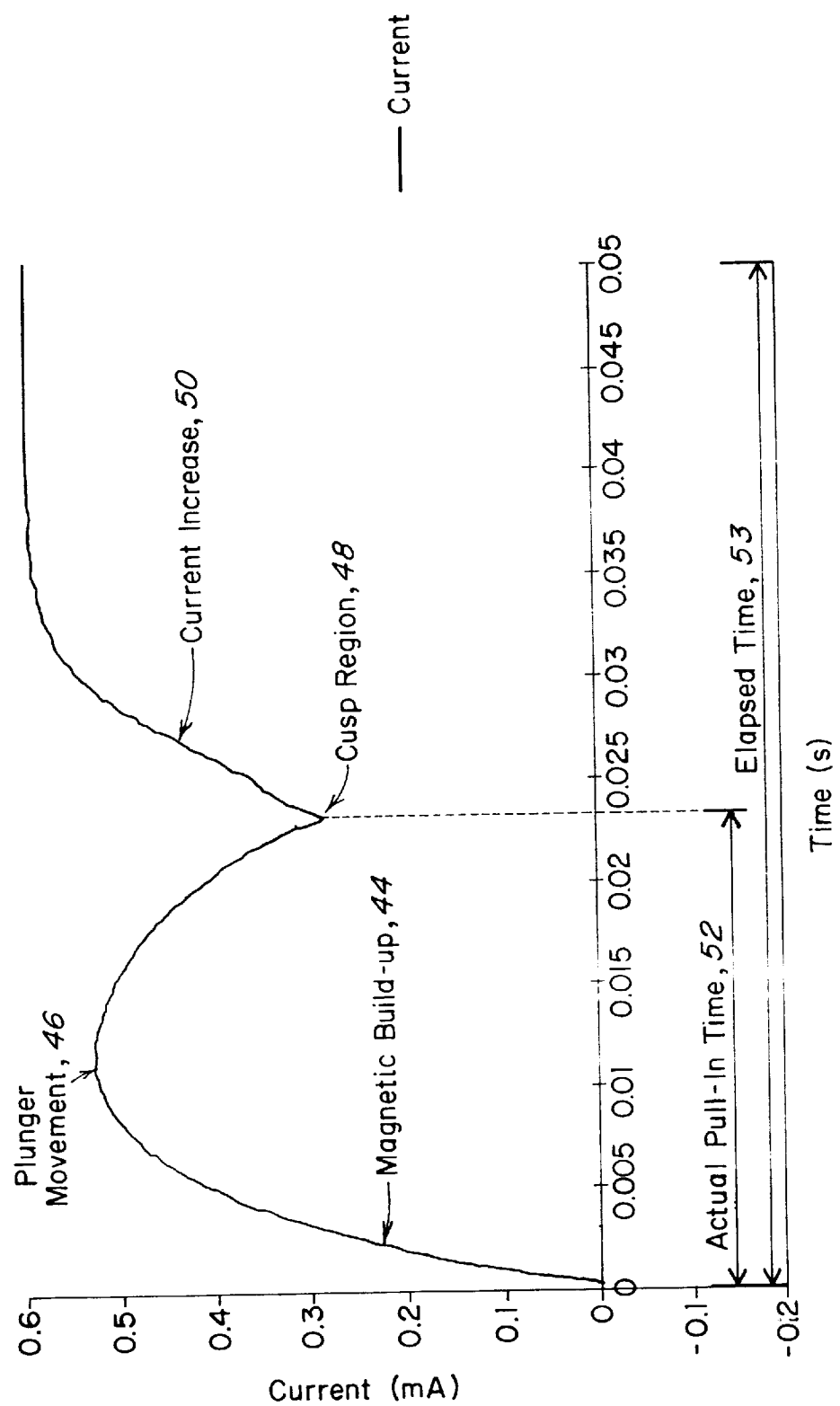
FIG. 6 is a graphical representation of the actuation current verses time according to the teachings of the present invention.

As the controller 54 applies the actuating current to the solenoid 38, a plunger 40 of the solenoid 38 eventually begins its motion from a first position to a second position. For example, the first position can be one in which the plunger 40 is initially in a retracted position as illustrated in FIG. 4, and the second position towards which the solenoid plunger 40 moves is an extended position as illustrated in FIG. 5. Alternatively, the first position can be an extended position (FIG. 5), and the second position can be a retracted position (FIG. 4). As the plunger 40 arrives at the second position and ceases motion, a cusp region is generated in the current waveform 45, as illustrated in FIG. 6. It is important to note that the extended and retracted positions of the plunger 40 of FIGS. 5 and 6 represent positions that are attainable by a particular solenoid 38 at any moment in time and under any condition. These positions do not necessarily represent a fully and completely extended or retracted solenoid 38 according to design specifications for the solenoid 38. Rather, this description is intended to represent an intermediate position between the fully extended and retracted positions that results if a solenoid 38 is not functioning properly, and there exists a hindrance to the solenoid 38, which prevents the completion of the desired movement to the fully retracted or extended positions. The present invention identifies such a faulty situation and determines if the solenoid 38 is functioning properly or not. The positions may, however, correspond to fully extended and fully retracted positions of the solenoid 38 if such solenoid 38 is indeed functioning properly.

To describe in more detail a typical current waveform, FIG. 6 illustrates a graph of the actuating current of the solenoid 38 relative to an elapsed time. The elapsed time in seconds is represented along the abscissa axis and the current in milliamperes is represented along the ordinate axis. At time zero (0), the actuating current is applied to the solenoid 38 and the recording of the current amplitude begins. The current level in the solenoid 38 increases due to inductance and is measured by the ammeter 56. Region 44 on the current waveform 45 represents a period of time during which there is a magnetic field buildup within the solenoid 38. As the current level increases and approaches region 46, the plunger 40 begins to move. The movement of the solenoid plunger 40 causes the measured current to decrease, as illustrated by the current waveform 45, until the plunger 40 motion ends at about the waveform cusp region 48. Until the actuating current is terminated, there is an additional magnetic field build-up within the solenoid 38, as illustrated by region 50 of the current waveform 45, as the solenoid current begins to increase again. During the course of actuating current application and measurement, the time elapsed is recorded by the chronograph 58 as illustrated by time region 53. The actual pull-in time of the solenoid is represented by time region 52.

Figure 7:
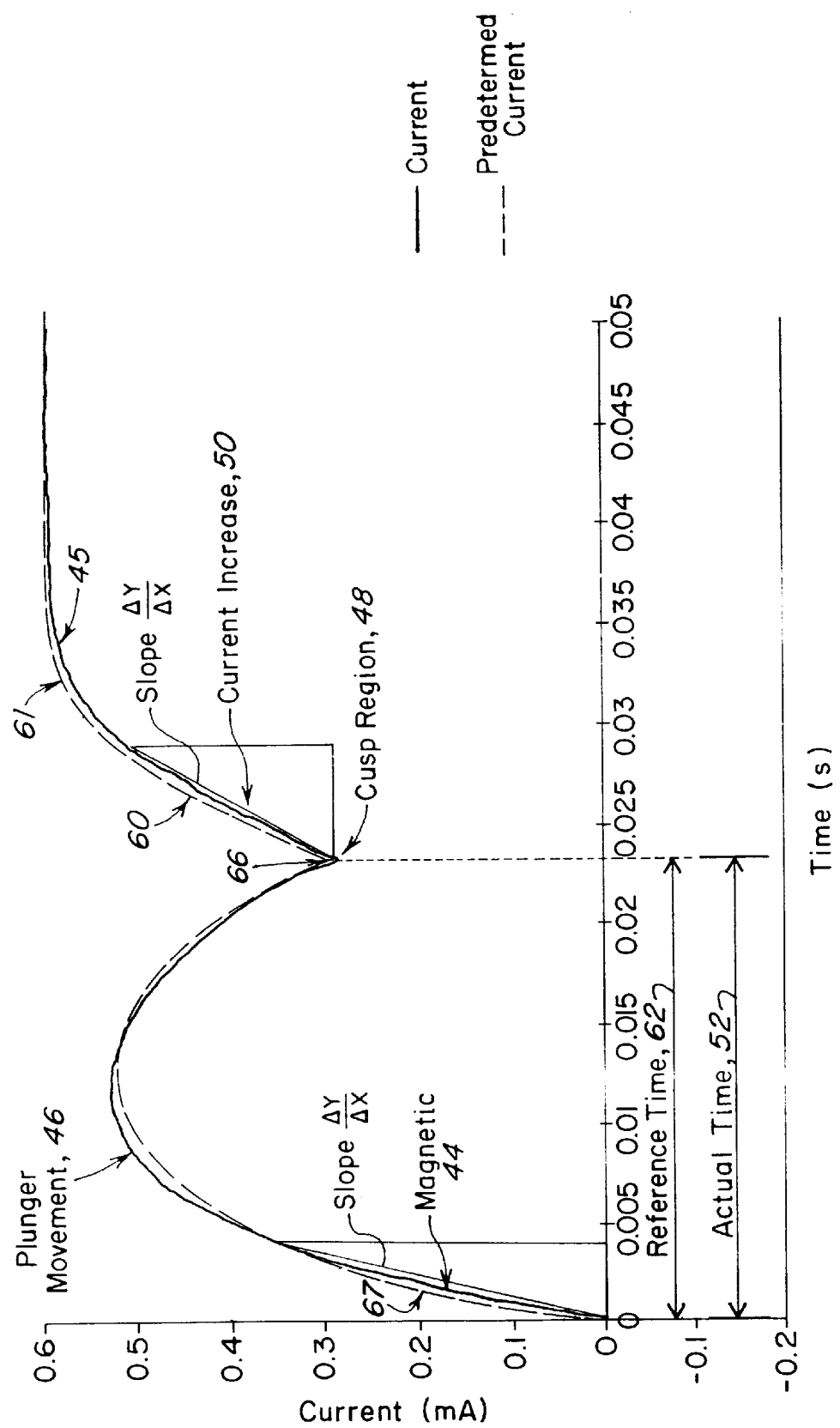
FIG. 7 is a graphical representation of the actuation current verses time, measured and predetermined, according to one embodiment of the present invention.

The measured values of the actuating current and time are then compared to predetermined current and time values, as illustrated in FIG. 7. According to one practice, an empirical process determines the predetermined current and time values. In such a process, repeated trials carried out on properly functioning solenoids produce data that is graphically illustrated as the predetermined current waveform 61 if desired. The predetermined waveform 61 is superimposed over the measured current waveform 45 for purposes of comparison. Alternatively, a formulaic approach can be utilized. The formulas are derived from the empirical data, and provide a guideline to which the actual measurements can be compared.

The empirical process to obtain the aforementioned waveforms and subsequent formulas was carried out as follows, and serves as one example as to how such a process can be executed. A solenoid was restrained in a fixed position by using, e.g., 0.04 inch spacers. A current was then passed through the solenoid and a first order waveform resulted having characteristics indicative of the position. The process was repeated, incrementally moving the plunger with additional spacers until the full excursion of the solenoid traversed from the fully retracted position to the fully extended position. A family of curves was then generated for a given style of solenoid. Analysis of the curves yielded a relationship, which allows one to determine the actual starting and ending points of the solenoid's travel by studying the waveform. Empirical relationships were then identified between the beginning and ending slopes for each curve in the family. This provided for the association of a given starting slope with a given start position and a given end slope with a given end position. A regression analysis was performed which resulted in the following equations. To determine the solenoid initial position (e.g., the fully extended starting position), the following formula can be utilized: $X_1 = A + Bx + Cx^2$, where A, B and C are empirical constants for a given type of solenoid. To determine the solenoid final position (e.g., the fully retracted finishing position), the following formula can be utilized: $X_f = D + E \ln(x)$, where D and E are empirical constants for a given type of solenoid. Utilizing these same formulas, the distance traveled by the solenoid plunger from a first or initial position to a second or final position can also be determined.

Those of ordinary skill in the art will readily recognize that the predetermined current waveform 61, as well as the predetermined time line 62, are mere examples of predetermined current and time values that can be generated in accordance with known techniques. The predetermined values are then compared with the measured values in current waveform 45 and time line 52. The comparison can be carried out by calculating a slope between two separated points along the current waveform portion being analyzed. As one of ordinary skill in the art comprehends, the slope is calculated by dividing the change in the value along the Y axis by the change in the value along the X axis. The slope of the measured current waveform can then be compared to the slope of the predetermined current waveform. Alternatively, an average slope of the curve can be calculated for comparison.

According to the present invention, a current buildup region 44 and a second current buildup region 50 of the current waveform 45 are important in determining if the solenoid 38 is functioning properly. These regions are independent of the various other locations along current waveform 45 representing positions of the solenoid plunger 40 as it moves between the first and second positions, which are not a concern of the present invention. If the slope of the plunger motion current buildup region 44 does not match up appropriately with the corresponding predetermined slope of current buildup region 67 of the predetermined waveform 61, and/or the slope of the second current buildup region 50 does not match the corresponding predetermined slope of region 60 of the predetermined waveform 61, then it may be determined that the plunger 40 of the solenoid 38 is not traveling from a fully extended to a fully retracted position. In conjunction with the current value comparison, a comparison of the value of the pull-in time, represented by the time line 52, with a predetermined pull-in time, represented by the time line 62, provides an indication as to whether or not the plunger 40 of the solenoid 38 traveled from the first to the second positions in the required, or specified, amount of time. If the plunger 40 moved between the fully extended and fully retracted positions, but did so in a period longer than the predetermined time, then it may be determined that the plunger 40 of the solenoid 38 is carrying too much of a load, or is experiencing frictional forces beyond design specifications. Hence, the solenoid 38 is considered not to be functioning properly. When the solenoid plunger 40 fails to fully extend and retract, and/or fails to operate within a predetermined amount of time, an indication of a malfunctioning solenoid may be made.

Those of ordinary skill in the art will readily recognize that the current waveform comparisons can be performed automatically by the image reproducing system 10. In the above-described scenario, a technician could remove the solenoid 38 for analysis off-site, or alternatively plug the solenoid into, e.g., a portable computer or other analyzing instrument. In an internal diagnostic scenario, the image reproducing system 10 includes computer software or an algorithm to, on a periodic basis or on demand by a user or technician, perform the foregoing current and time measurements and execute the comparison as illustrated herein to determine the functioning characteristics of each solenoid 38 within the image reproducing system 10.

Figure 8:
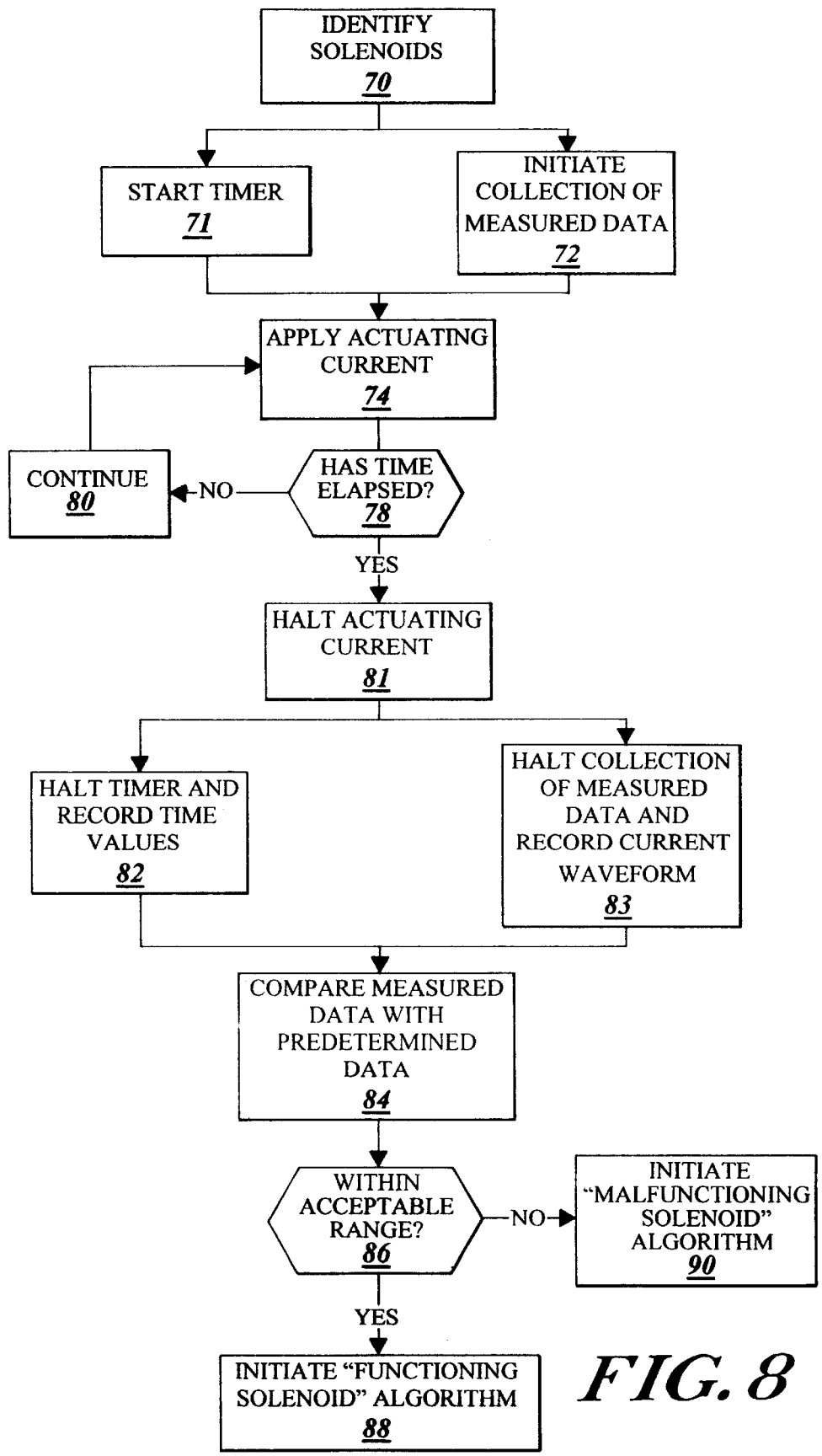
FIG. 8 is a schematic flow chart diagram illustrating the steps performed to determine whether the solenoid is functioning properly according to the teachings of the present invention.

FIG. 8 is a schematic flow chart diagram illustrating the method for determining whether a solenoid is functioning properly in accordance with the teachings of the present invention. The method is not specific to the illustrated image reproducing system 10, but rather is applicable to myriad systems able to support such an algorithm.

In operation, the control stage 16 of the image reproducing system 10 first identifies the solenoids to be diagnosed (step 70). The solenoid originates in a first position. For example, the first position may be achieved by the action of the return spring from a previous actuation. The ammeter 56 and chronograph 58 initiate measurement and begin recording the current value (step 72) and the elapsed time value (step 71). At substantially the same time the controller 56 applies the actuating voltage resulting in an actuating current to the solenoid 38 for a predetermined amount of time (step 74), and moves the plunger 40 from the first position to the second position. When the solenoid plunger 40 reaches the second position, a cusp 48 forms on the current waveform. The controller 56 continues the actuation voltage to the solenoid until reaching the end of the predetermined amount of time (step 78). Contemporaneously, the current waveform 45 is measured as region 50 develops. The controller 56 tracks the actuation voltage and current, and checks whether the predetermined amount of time has elapsed. If not, the controller continues the application (step 80). The controller 56 halts application of the actuating current (step 81) to the solenoid at the end of the predetermined amount of time. The collection of measured data is then halted (step 83), the timer is halted (step 82), and the current waveform and time values are recorded.

After the actuation time has elapsed, the controller 54 then compares: the current measurements prior to the beginning of plunger 40 movement to predetermined current values prior to the beginning of plunger 40 movement; the current values between the cusp portion 48 (end of plunger 40 movement) of the measured current waveform and halting of actuating current, to predetermined current values 60; and the beginning and ending of plunger 40 movement measured time values with predetermined time values (step 84). Based on this information, the controller 54 determines whether the measured current and time values are within or outside a predetermined acceptable range and/or margin of error relative to the predetermined current and time values (step 86). If the measured values are within the acceptable range, the controller 54 determines that the solenoid is functioning properly (step 88). If the measured values are not within the acceptable range, the controller 54 determines that the solenoid is functioning improperly (step 90). The image reproducing system 10 or controller 54 can also perform certain other selected tasks, such as notify users of the solenoid condition, schedule maintenance, or generate any other visual or audible signal to represent the solenoid condition.

An advantage of the present invention is that the diagnosis of whether or not a particular solenoid is functioning properly is more reliable. The comparison of current values in conjunction with the comparison of elapsed time values offers a method and apparatus that verifies and confirms its own diagnosis. Acquisition and comparison of the current values without regard to the time values, and acquisition and comparison of the time values without regard to the current values could lead to misdiagnosis. Further, the illustrated embodiments of the present invention focus on values representing the instances where the solenoid is found in two crucial positions, those states of being retracted and extended, and the build up of current prior to movement and after movement ceases. The method is efficient in that it does not maintain or analyze extraneous data from intermediate solenoid positions between the retracted and extended positions. In addition, there is no need to maintain extensive tables of information on different current values and time values for intermediate solenoid positions. Therefore, less storage space or memory is required to gather the requisite data, and a faster analysis can be performed resulting in a quicker diagnosis.

Numerous modifications and alternative embodiments of the invention will be apparent to those skilled in the art in view of the foregoing description. Accordingly, this description is to be construed as illustrative only and is for teaching those skilled in the art the best mode for carrying out the invention. Details of the structure may vary substantially without departing from the spirit of the invention, and exclusive use of all modifications that come within the scope of the appended claims is reserved. It is intended that the invention be limited only to the extent required by the appended claims and the applicable rules of law.

What is claimed is:

1. In an image forming system, a method for diagnosing whether a solenoid is functioning properly, the method comprising the steps of:

sending an actuating voltage having an associated value to said solenoid;

measuring an actuating current value and a time value as a plunger of said solenoid moves from a first position to a second position in response to said actuating current; and based at least partially on said measured actuating current values and said measured time values, determining whether said solenoid is functioning properly by comparing current and time values occurring after initiation of said actuating voltage and prior to said plunger moving from said first position, and by comparing current and time values occurring after said plunger arrives at said second position and prior to a ceasing of said actuating current.

2. The method according to claim 1, wherein said step of determining comprises the step of comparing said measured time and actuating current values with predetermined time and actuating current values corresponding to a properly functioning solenoid.

3. The method according to claim 2, wherein the step of determining further comprises the step of calculating a difference between said measured actuating current and time values and said predetermined actuating current and time values, said differences indicating whether said solenoid is functioning properly based at least partially on whether said differences are within a predetermined range.

4. The method according to claim 1, wherein the step of determining comprises the step of evaluating said measured actuating current and time values relative to predetermined actuating current and time values for properly functioning solenoids, such that measured actuating current and time values matching said predetermined actuating current and time values, within a predetermined margin of error and at instances in time corresponding to solenoid movement initiation and conclusion, is an indication of a properly functioning solenoid.

5. The method according to claim 1, wherein said first position is an extended position, and said second position is a retracted position.

6. The method according to claim 5, wherein said extended position corresponds to a position such that said solenoid will not extend farther, and said retracted position corresponds to a position such that said solenoid will not retract father.

7. The method according to claim 5, wherein said extended position corresponds to a position such that said solenoid is fully extended, and said retracted position corresponds to a position such that said solenoid is fully retracted.

8. The method according to claim 1, further comprising the step of determining said predetermined actuating current and time values by at least one of empirical and formulaic procedures.

9. The method according to claim 1, further comprising the step of determining said predetermined solenoid initial position using the equation $X_1 = A + Bx + Cx^2$.

10. The method according to claim 1, further comprising the step of determining said predetermined solenoid final position using the equation $X_f = D + E \ln(x)$.

11. In an image forming system, a method for determining whether a solenoid is functioning properly, the method comprising the steps of:

applying an actuating current to said solenoid while measuring a start time value and first current build-up values;

moving a plunger of said solenoid from a first position to a second position coinciding with a cusp region in a current waveform generated from said actuating current and conclusion of movement of said solenoid;

measuring second current build-up values and an end time value;

comparing slopes of said measured first and second current build-up values to one or more predetermined current slopes for a properly functioning solenoid; and based at least partially on said comparison of current and time values, determining whether said solenoid is functioning properly.

12. The method according to claim 11, wherein the step of determining comprises the steps of:

calculating a difference between said first and second current slopes and said predetermined current slopes; and calculating a difference between said start and end time values and said predetermined time values;

wherein said differences indicate whether said solenoid is functioning properly based at least partially on whether said differences are within a predetermined range.

13. The method according to claim 11, wherein the step of determining comprises the step of:

calculating a distance traveled by said plunger of said solenoid from said first position to said second position.

14. In an image forming system, a self-diagnostic method for determining whether a plurality of solenoids within said system are functioning properly, said method comprising the steps of:

sending an actuating current to each of said plurality of solenoids;

measuring actuating current values and time values prior to a plunger of each of said plurality of solenoids moving between a first position and after arriving at a second position in response to said actuating current;

correlating said measured actuating current and time values with predetermined actuating current values and time values for properly functioning solenoids; and based at least partially on said correlation, indicating a functioning status of one or more of said plurality of solenoids.

16. The method according to claim 14, wherein said first position is an extended position, such that said solenoid will not extend farther, and said second position is a retracted position, such that said solenoid will not retract farther.

16. The method according to claim 14, wherein said first position corresponds to a position such that said solenoid is fully extended, and said second position corresponds to a position such that said solenoid is fully retracted.

17. An image forming system for diagnosing whether a solenoid is functioning properly, comprising:
 a controller for providing an actuating current to said solenoid;
 a current measuring device for measuring an actuating current within said solenoid as a plunger of said solenoid moves from a first position to a second position; and
 a time measuring device for measuring an elapsed time between said first and second positions of said solenoid.

18. The system according to claim 17, further comprising a microprocessor for collecting data from said current measuring device and said time measuring device.

19. The system according to claim 17, further comprising a microprocessor for collecting data from said current and time measuring devices, correlating said data with predetermined current values and predetermined time values for properly functioning solenoids, and indicating a functioning status of said solenoid.

* * * * *